United States Patent [19]
Shikata

[11] Patent Number: 5,208,771
[45] Date of Patent: May 4, 1993

[54] SEMICONDUCTOR MEMORY APPARATUS

[75] Inventor: Michiharu Shikata, Kusatsu, Japan

[73] Assignee: Matsushita Electronics Corporation, Osaka, Japan

[21] Appl. No.: 605,314

[22] Filed: Oct. 30, 1990

[30] Foreign Application Priority Data

Oct. 30, 1989 [JP] Japan .................... 1-283280

[51] Int. Cl.⁵ .............................. G11C 7/06
[52] U.S. Cl. .................... 365/154; 365/205; 365/230.06; 365/233
[58] Field of Search ........... 365/233, 154, 156, 230.06, 365/205

[56] References Cited
FOREIGN PATENT DOCUMENTS 0306712 3/1989 European Pat. Off. .
62-162297 7/1987 Japan .................... 365/225
2190808 11/1987 United Kingdom .

Primary Examiner—Joseph E. Clawson, Jr.
Attorney, Agent, or Firm—Lowe, Price, LeBlanc & Becker

[57] ABSTRACT

In a semiconductor memory apparatus having a plurality of sense amplifiers each including a pair of flip-flops respectively formed of n-channel and p-channel FETs, the flip-flops being connected in parallel between a pair of data lines each coupled to receive data signals from a plurality of memory cells, the p-channel flip-flops are activated prior to the n-channel flip-flops at the start of a memory read operation, to thereby ensure that even with an adverse combination of logic states of a data word read from a very large storage capacity memory, there will be no significant difference between the respective time points at which amplification by the n-channel flip-flop and p-channel flip-flops of each sense amplifier begin.

1 Claim, 7 Drawing Sheets

SEMICONDUCTOR MEMORY APPARATUS

BACKGROUND OF THE INVENTION

1. Field of Applicable Technology

The present invention relates to improvements of sense amplifier circuits in a dynamic random access type of semiconductor memory apparatus.

2. Prior Art Technology

In recent years, there has been a considerable increase in the storage capacity and speed of operation that are possible with semiconductor memories, and the field of applications of such memories is rapidly widening. Of the various types of semiconductor memory apparatus, the dynamic random access (abbreviated in the following to DRAM) type of semiconductor memory apparatus has the advantages of a simple circuit configuration and ease of implementation in integrated circuit form, together with a low manufacturing cost. For these reasons the DRAM semiconductor memory apparatus is the main type of memory used to achieve a very large storage capacity. In recent years, technical emphasis has been placed upon achieving DRAMS which have very large storage capacity, together with high speed operation and low power consumption. One of the most important technical point in achieving such a combination of high speed and low power consumption in a large-capacity DRAM is to utilize sense amplifier circuits (for reading out stored data from the memory) which have a high speed of operation and low power consumption. Such sense amplifier circuits must be capable of amplifying the extremely low-level signals that are produced when the memory cells are read, and various techniques have been adopted to achieve this.

A type of sense amplifier circuit that is widely used in the prior art with such a semiconductor memory apparatus will be described in the following, referring to FIG. 1. This is an example of the use of a prior art CMOS type of sense amplifier circuit in a DRAM. Such a circuit is widely employed due to the advantages of a simple circuit arrangement and high operation speed, together with low power consumption. In FIG. 1, the DRAM has 1024 columns of memory cells, with two rows of the memory cells being shown and with columns 3 to 1023 being omitted from the drawing (the rows and columns being oriented respectively vertically and horizontally in the drawing). Respective sense amplifier circuits are provided for each of these columns, with the sense amplifier circuits of the first, second and 1024$^{th}$ columns being respectively designated by reference numerals 21, 22 and 23, while the circuit further includes a row decoder for executing row selection, and sense amplifier circuit drive circuits The circuit blocks 1 to 6 denote respective memory cells. Of these, the blocks 1 to 3 (each coupled to the word line WL1, in the first, second and 1024$^{th}$ columns respectively of one row) are respectively made up of a transistor Q13, and a capacitor C1, Q14 and C2, Q15 and C3, while each of the circuit blocks 4, 5 and 6 (each coupled to word line WL2, in the first, second and 1024$^{th}$ columns respectively of the other row) is identical in configuration to the blocks 1 to 3, with the internal components of blocks 4 to 6 being omitted from the drawing. The sense amplifier circuit 21 of the first column consists of a pair of data lines designated as DL1 and $\overline{DL1}$, a pair of p-channel MIS FETs (metal insulation semiconductor field effect transistors) Q1 and Q2 having the source electrodes thereof connected in common and having the drain electrodes and gate electrodes thereof mutually cross-coupled to form a dynamic flip-flop, and also a pair of p-channel MIS FETs Q3 and Q4 having the source electrodes thereof connected in common and having the drain electrodes and gate electrodes thereof mutually cross-coupled to form a dynamic flip-flop. The sense amplifier circuits of the other columns are identical in configuration to sense amplifier circuit 21. In the second column, the pair of data lines are designated as DL2 and $\overline{DL2}$, and the sense amplifier circuit transistors as Q5, Q6, Q7 and Q8, while in the 1024$^{th}$ column, the pair of data lines are designated as DL1024 and $\overline{DL1024}$, and the sense amplifier circuit transistors as Q9, Q10, Q11, Q12. A row decoder 7 serves to select one of the word lines WL1 and WL2 in accordance with an address input signal, and activates the selected word line by an activation signal $\phi W$. The respective source electrode nodes of the n-channel sides of the 1024 sense amplifier circuits are each connected to a common node SAN, while the source electrode nodes of the p-channel sides of the sense amplifier circuits are each connected to a common node SAP. A p-channel MIS FET Q17 is connected as a switching transistor between the p-channel node SAP and the positive potential $V_{DD}$ of a power source, while an n-channel MIS FET Q16 is connected similarly between the n-channel node SAN and ground potential (i.e. the 0V potential of the power source). R1 and R2 represent respective lead resistances. A clock signal generating circuit 8 generates the word line activation signal $\phi W$, from a reference clock input signal RAS, a clock signal generating circuit 9 generates a clock signal $\phi N$ that is supplied to the gate electrode of the n-channel MIS FET Q16 as an activation signal for the n-channel flip-flops of the sense amplifier circuits, with $\phi N$ being derived from the clock signal $\phi W$, and a clock signal generating circuit 10 generates a clock signal $\phi P$ that is applied to the gate electrode of the switching transistor Q17 as an activation signal for the p-channel flip-flops of the sense amplifier circuits, with $\phi P$ being derived from the clock signal $\phi N$.

The operation of the sense amplifier circuit circuits in such a prior art semiconductor memory apparatus will be described in the following.

FIG. 2 shows voltage waveforms at respective nodes in the circuit of FIG. 1. The waveforms illustrate a read operation, for the case in which the word line WL1 is activated (i.e. in which the memory cells 1, 2, 3, are selected) and in which all of the selected memory cells have a data value of logic 0 stored therein. It will be assumed that storage of the data value 0 in a memory cell is represented by the capacitor (e.g. C1, C2 or C3) of the memory cell being charged such that there is a potential difference of $V_{DD}$ across the capacitor (i.e. the capacitor terminal which is coupled to the transistor of that memory cell is at ground potential). while storage of the data value 1 is represented by the capacitor of the memory cell having zero charge therein (i.e. the capacitor terminal which is connected to the transistor of that memory cell is at the $V_{DD}$ potential). It will further be assumed that when the reference clock signal RAS is at the non-active level (i.e. in this embodiment, the high logic level), each of the data lines DL1 to $\overline{DL1024}$ and the nodes SAP, SAN is maintained at a potential that is one half of the power source voltage $V_{DD}$, i.e. these are charged to a preparatory level of $V_{DD}/2$. Means for maintaining such a preparatory voltage level in a DRAM are well known in the art, and description will therefore be omitted. The operation will be described in the following referring to FIG. 2. Firstly, at the time point t1, the reference clock input RAS goes to the active level (i.e. the low logic level). Next, at time point t2, φW goes to the active level (the high logic level), and the word line WL1 is activated by the row decoder 7, the transfer gates within the memory cells 1, 2, 3, etc. (i.e. Q13, Q14, Q15) are each set in the conducting condition, and an amount of charge corresponding to the data value 0 is thereby transferred to each of the the data lines DL1, DL2, . . . DL1024. As a result, the respective potentials of each of the data lines DL1 to DL1024 falls slightly, i.e. moves towards ground potential, by an amount ΔV. If for example the stray capacitance of each of the data lines is approximately 10 times the value of capacitance of each memory cell capacitor, then ΔV will be approximately equal to $V_{DD}/20$. Next, at time point t3, the signal φn goes to the active level (i.e. the high logic level), the switching transistor Q16 is thereby set in the conducting condition, and the n-channel node SAN begins to be discharged. As this discharging of the n-channel node SAN proceeds, when the difference between the data line of each data line pair that goes to the higher potential of the pair (i.e., in the case of FIG. 2, each of the data lines $\overline{DL1}, \ldots, \overline{DL1024}$) and the potential of the n-channel node SAN rises above the threshold voltage $V_{TN}$ of the n-channel MIS FETs in the sense amplifier circuits, i.e. at the time point t4, one of the transistors (i.e. Q3, Q7, Q11) of each of the n-channel flip-flops enters the conducting condition. Discharging of the data lines DL1 to DL1024 thereby begins, and amplification operation by the n-channel flip-flop is started. As a result, subsequent to the time point t4, all of the sense amplifier circuits that are connected to the n-channel node SAN are activated (i.e. triggered), and since the load of the switching transistor Q16 now includes 1024 data lines (i.e. one data line of each of the pairs of data lines DL1 to DL1024), the rate of fall of potential of the n-channel node SAN becomes slower than the rate of fall prior to the time point t4. Next, at the time point t5, the p-channel activation signal φP goes to the active level (i.e. the low level), the switching transistor Q17 is set in the conducting condition, and discharging of the p-channel node SAP begins. As will be clear from the fact that the p-channel flip-flops and n-channel flip-flops have a symmetrical circuit configuration, the basic operation of the p-channel flip-flops following the time point t5 will be similar to that of the n-channel flip-flops, with opposite polarities. Specifically, at the time point t6, the potential difference between the data lines DL1 to DL1024 and the p-channel node SAP begins to exceed the threshold voltage $V_{TP}$ of the p-channel MIS FETs, thereby activating the p-channel MIS FETs, so that charging of the p-channel node SAP begins. Eventually the potential of the data lines DL1 to DL1024 reaches 0V, and the potential of the data lines $\overline{DL1}$ to $\overline{DL1024}$ reaches the level $V_{DD}$. This completes a sense amplifier circuit operation.

Thus with a prior art sense amplifier circuit for a semiconductor memory apparatus, the operation sequence is as follows. Firstly, the n-channel dynamic flip-flops are set in operation. When the amplification has increased to a certain degree, the p-channel dynamic flip-flops are set in operation. The reasons for adopting such a procedure include such factors as the degree of channel surface mobility in each MIS FET, so that an n-channel dynamic flip-flop has a greater amplification factor than a p-channel dynamic flip-flop. Thus, improved performance is achieved if the p-channel flip-flops are actuated after the operation of the n-channel flip-flops has advanced to a certain stage (specifically, to the condition in which a large potential difference has developed between the data lines of each data line pair). That is to say, by ensuring that amplification is started by the n-channel flip-flop of each sense amplifier in response to a voltage difference produced between the data line pair of that sense amplifier, the data thereby generated on the data lines can be made available as rapidly at possible to the next stage, i.e. to a data bus.

However with such a prior art semiconductor memory apparatus in which the the n-channel dynamic flip-flop of each sense amplifier circuit is set in operation prior to the p-channel dynamic flip-flop of the sense amplifier circuit, the following problems arise. Referring to FIG. 3, the operation will be described assuming that read-out is to be executed with the word line WL1 activated, and assuming that memory cell 1 of the selected memory cells stores the data value logic 0 and all of the remaining selected memory cells (2, 3, . . . ) store the data value logic 1. FIG. 3 shows the voltage waveforms at the various nodes for such a case. The time points at which the clock signals RAS, φW, φN, and φP go to their respective active levels are identical to those of FIG. 2 described above, i.e. the time points t1, t2, t3 and t5. At t2, the word line activation signal φW goes to the active level, whereby the word line WL1 is activated. Since charge is thereby transferred from the memory cells 1, 2, 3 to the data lines DL1, DL2, . . . DL1024, and since as described above the memory cell 1 stores the data value 0, the potential of the data line DL1 will fall by the amount ΔV, while since the other memory cells each have the data value 1 stored therein, each of the data lines DL2 to DL1024 will increase in potential by the amount ΔV. At the time point t3, the n-channel activation signal φN goes to the active level, and the switching transistor Q16 is thereby set in the conducting condition, whereby the potential of the n-channel node SAN falls. Thereafter, the potential difference between each of the high-potential data lines DL2 to DL1024 and the n-channel node SAN rises above the n-channel MIS FET threshold voltage $V_{TN}$ (at time point t4'). Amplification by the respective n-channel flip-flops corresponding to the data lines DL2 to DL1024 begins, so that discharging of the data lines $\overline{DL2}$ to $\overline{DL1024}$ begins, At the time point t4', the n-channel flip-flop corresponding to the data line DL1 is not activated, since at that time the potential difference between the data line $\overline{DL1}$ and the n-channel node SAN is lower than $V_{TN}$. Discharging of the n-channel node SAN proceeds, and at the time point t4" (i.e. the point at which the potential difference between the data line $\overline{DL1}$ and the n-channel node SAN reaches the value $V_{TN}$) the n-channel MIS FET Q3 of the sense amplifier circuit 21 is set in the conducting condition, so that the n-channel flip-flop of the sense amplifier circuit 21 is activated, and amplification of the DL1 potential begins.

As can be seen from FIG. 3, there is a substantial difference between the time points at which respective sense amplifier circuits are activated in such a case, with a prior art DRAM dma. As a result of very small differences between the data line potentials at the time point when the signal φN goes to the active level (i.e. the potential ΔV, in the case of FIG. 3, between each of the data lines DL2 to DL1024 and the data line DL1), a difference arises between the respective time points at which amplification by the n-channel flip-flops begins. The slower the rate of fall of potential of the n-channel node SAN, following the time point t4', the greater will become such a difference between the times at which amplification by the n-channel flip-flops begins. In the case of FIG. 3, since the memory condition is assumed in which data value 0 is stored only the memory cell 1 and each of the memory cells 2 to 1024 has the data value 1 stored therein, the majority of the sense amplifier circuits that are connected in common to the n-channel node SAN will be activated at the time point t4'. Since the load of the switching transistor Q16 then becomes high (i.e. since a large number of data lines, and hence a large value of capacitance, must now be discharged by the current flow through that transistor), the rate of fall of potential of the n-channel node SAN will be significantly lower than was the case prior to the time point t4'. Thus in such a case, the start of operation of the sense amplifier circuit that is connected to the data line pair DL1, $\overline{DL1}$ will be considerably delayed by comparison with the other sense amplifier circuits.

A similar problem arises in the activation timings of the p-channel flip-flops of the sense amplifiers. In the example of FIG. 3, at the time point t5 when the potential rise of the p-channel node SAP begins, since the potential of each of the data lines $\overline{DL2}$ to $\overline{DL1024}$ is lower than that of the data line DL1, the p-channel flip-flops that correspond to the data lines DL2 to DL1024 will each be activated first (at time point t6'), while the start of operation of the p-channel flip-flop that corresponds to the data line DL1 will be delayed (i.e. starting at time point t6").

In this way, when the prior art configuration of FIG. 1 is utilized, then when the majority of the memory cells of a selected word line have the data value 1 stored therein, the remaining memory cells, which store the value 0, will exhibit a substantial delay in the start of sense amplifier circuit operation. That problem becomes especially severe in the case of a semiconductor memory apparatus having a very large storage capacity, since in that case the value of lead resistance through which current must flow in order to discharge the data lines (i.e. the values R1, R2 in FIG. 3, and the total amount of data line capacitance that must be discharged, will both be accordingly large.

SUMMARY OF THE INVENTION

It is an objective of the present invention to overcome the above problem of the prior art, by providing a semiconductor memory apparatus having sense amplifier circuits each formed of a pair of flip-flops respectively formed of n-channel and p-channel FETs, the flip-flops being connected in parallel between a pair of data lines each coupled to receive data signals from a plurality of memory cells, whereby minimization is achieved of a difference between sense amplifier circuit operation starting time points (the difference resulting from a difference between the potentials of respective data lines at the time of sense amplifier circuit activation), with the sense amplifiers providing a high speed of operation.

To achieve the above objectives, the p-channel flip-flops are activated prior to the n-channel flip-flops at the start of a memory read operation, to thereby ensure that even under a worst-case condition of logic states of a data word read from the memory, there will be no significant difference between the respective time points at which amplification by the n-channel flip-flop and p-channel flip-flops of each sense amplifier begin.

More specifically, according to a first aspect of the invention, a semiconductor memory apparatus is provided which comprises a plurality of sense amplifier circuits arrayed in parallel, each sense amplifier circuit including:

first and second data lines respectively connected in parallel to a plurality of memory cells;

a first flip-flop formed of first and second n-channel MIS FETs with the source electrodes thereof connected in common, with the gate electrodes and drain electrodes thereof mutually cross-coupled, and with the drain electrodes thereof respectively connected to the first and second data lines;

a second flip-flop formed of first and second p-channel MIS FETs with the source electrodes thereof connected in common, the gate electrodes and drain electrodes thereof mutually cross-coupled, and with the drain electrodes thereof respectively connected to the first and second data lines, the source electrodes of the first flip-flops of the plurality of sense amplifier circuits being mutually connected as a first common connection node, and the source electrodes of the second flip-flops of the plurality of sense amplifier circuits being mutually connected as a second common connection node;

a first switching transistor coupled between the first common connection node and a first potential of a power source;

a second switching transistor coupled between the second common connection mode and a second potential of the power source; and operation timing means for functioning, when a read operation of the semiconductor memory apparatus is initiated, to consecutively set the second switching transistor into a conducting condition at a first predetermined time point and to set the second switching transistor into a conducting condition at a first predetermined time point subsequent to the first time point.

According to a second aspect, the present invention provides a semiconductor memory apparatus comprising a plurality of sense amplifier circuits arrayed in parallel, each sense amplifier circuit including:

first and second data lines respectively connected in parallel to a plurality of memory cells;

a first flip-flop formed of first and second n-channel MIS FETs with the source electrodes thereof connected in common, with the gate electrodes and drain electrodes thereof mutually cross-coupled, and with the drain electrodes thereof respectively connected to the first and second data lines;

a second flip-flop formed of first and second p-channel MIS FETs with the source electrodes thereof connected in common, the gate electrodes and drain electrodes thereof mutually cross-coupled, and with the drain electrodes thereof respectively connected to the first and second data lines, the source electrodes of the first flip-flops of the plurality of sense amplifier circuits being mutually connected as a first common connection node, and the source electrodes of the second flip-flops of the plurality of sense amplifier circuits being mutually connected as a second common connection node;

a first switching transistor coupled between the second common connection node and a first potential of a power source;

a second switching transistor coupled between the first common connection mode and a second potential of the power source;

a third switching transistor coupled between the first common connection node and the first potential of the power source; and operation timing means for functioning when a read operation of the semiconductor memory apparatus is initiated to consecutively set the first switching transistor into a conducting condition at a first predetermined time point, the second switching transistor into a conducting condition at a second predetermined time point subsequent to the first time point, and the third switching transistor into a conducting condition at a third predetermined time point subsequent to the second time point.

DESCRIPTION OF PREFERRED EMBODIMENTS

Figure 1:
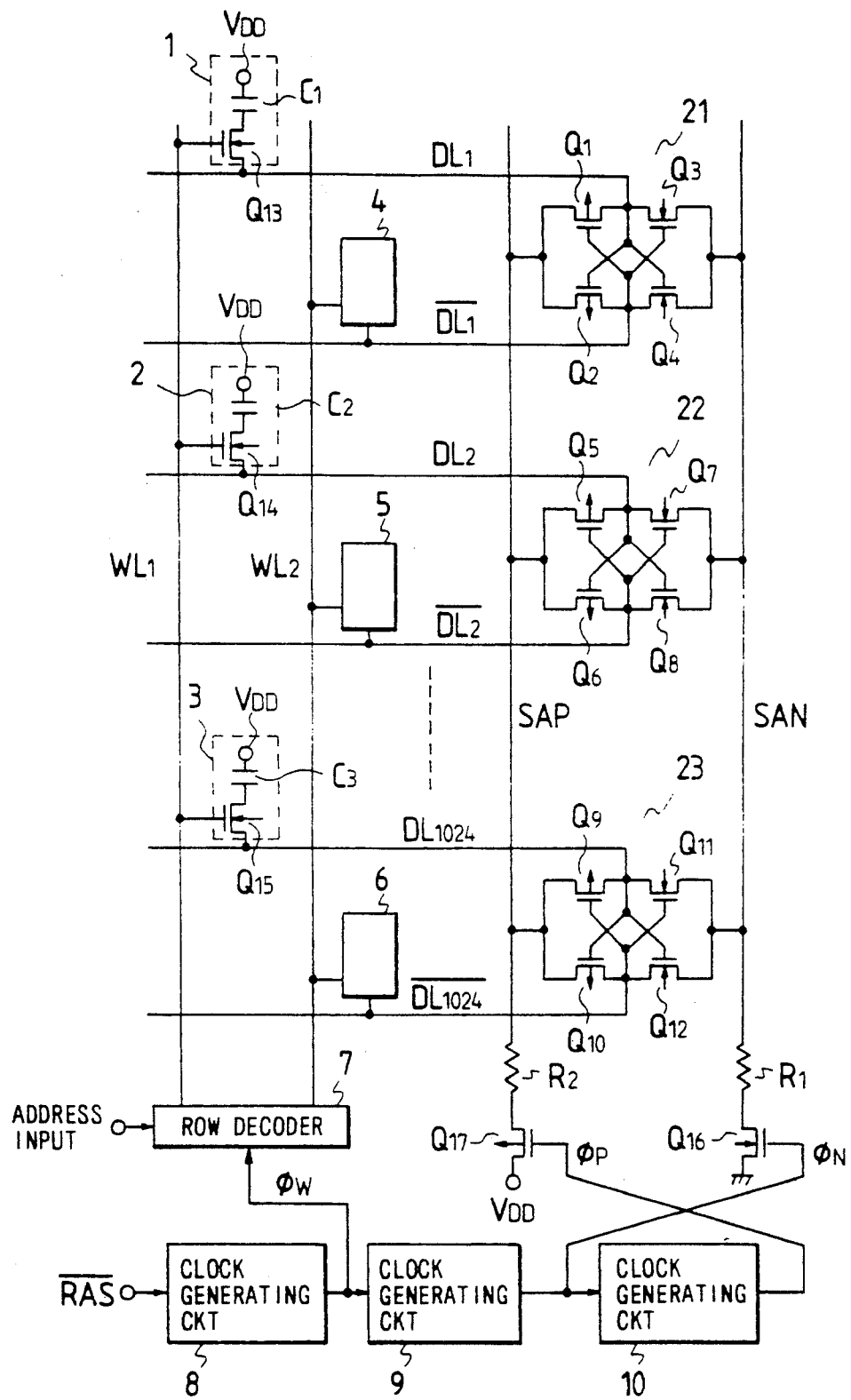
FIG. 1 is a circuit diagram of drive circuits and sense amplifier circuits of a memory array of a semiconductor memory apparatus according to the prior art.
Figure 4:
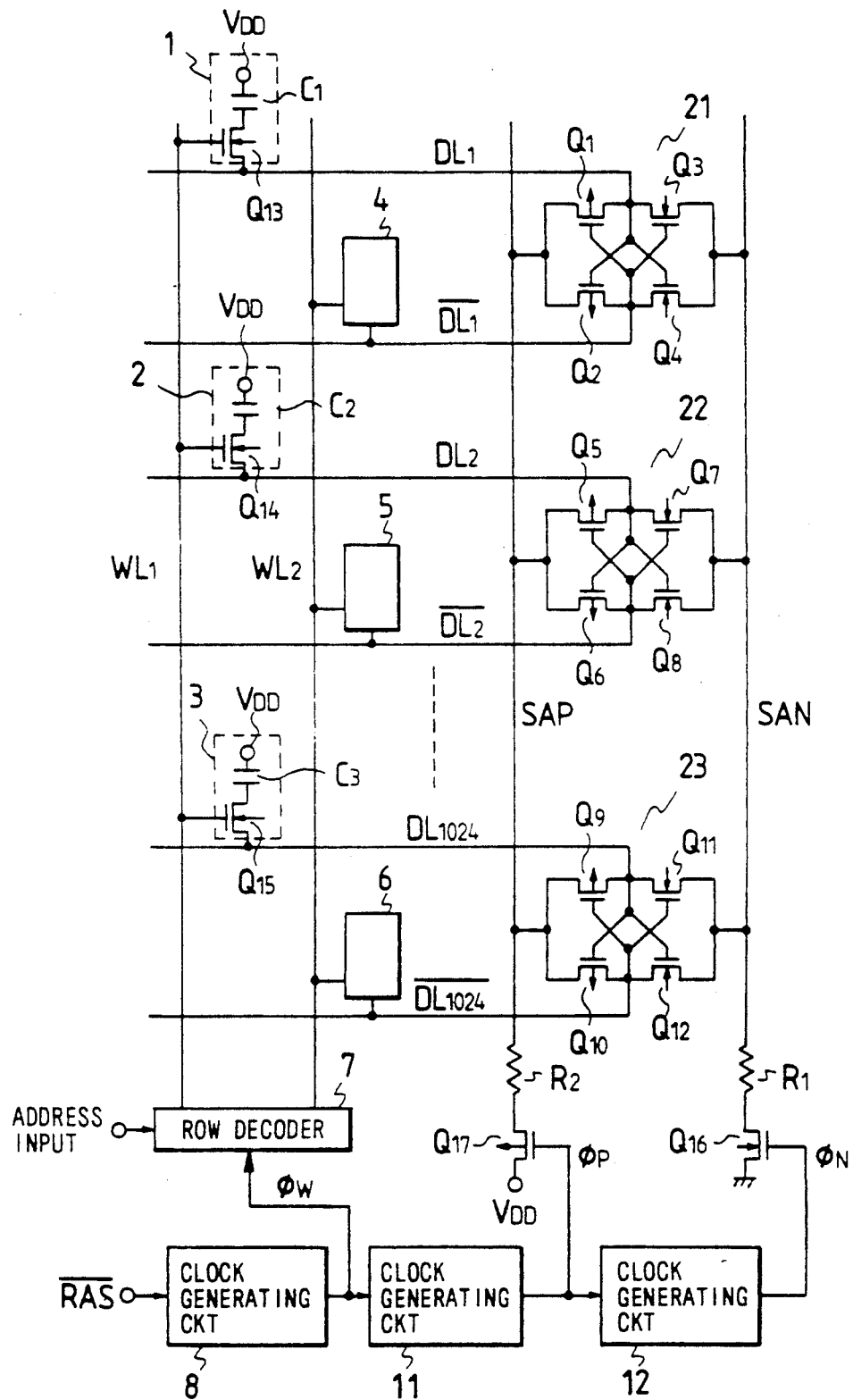
FIG. 4 is a circuit diagram of sense amplifier circuit circuits and drive circuits of a memory array of a semiconductor memory apparatus according to a first embodiment of the present invention.

FIG. 4 shows the main components of a first embodiment of a semiconductor memory apparatus according to the present invention, which is based on CMOS sense amplifier circuits. As in the prior art example of FIG. 1, there are two rows of 1024 columns of memory cells, with the columns 3 to 1023 being omitted from the drawing. Components in FIG. 4 corresponding to respective components in the prior art example of FIG. 1 are designated by identical reference numerals, and further description of these will be omitted. The overall configuration of this embodiment differs from the prior art example of FIG. 1 only with respect to the drive operation of the switching transistors Q16 and Q17, which will be described in detail in the following. Specifically, a clock signal generating circuit 11 generates from the word line activation signal $\phi W$ (generated by the clock signal generating circuit 8) a p-channel side activation signal $\phi P$ (i.e. a signal for activating the p-channel flip-flops of the sense amplifier circuits 21, 22, 23) which is applied to the gate electrodes of the switching transistor Q17. A clock signal generating circuit 12 generates from the activation signal $\phi P$ a signal $\phi N$, for activating the n-channel flip-flops of the sense amplifier circuits, which is applied to the gate electrode of the switching transistor Q16 The operation of this embodiment differs from the prior art example of FIG. 1 described hereinabove in the following points. In FIG. 4, the order in which the signals from the clock generating circuits 11 and 12 are applied is the opposite of that of the corresponding circuits in the example of FIG. 1, so that the activation signal $\phi P$ for the p-channel flip-flops of the sense amplifier circuits goes to the active level prior to the activation signal $\phi N$ of the n-channel flip-flops.

Figure 2:
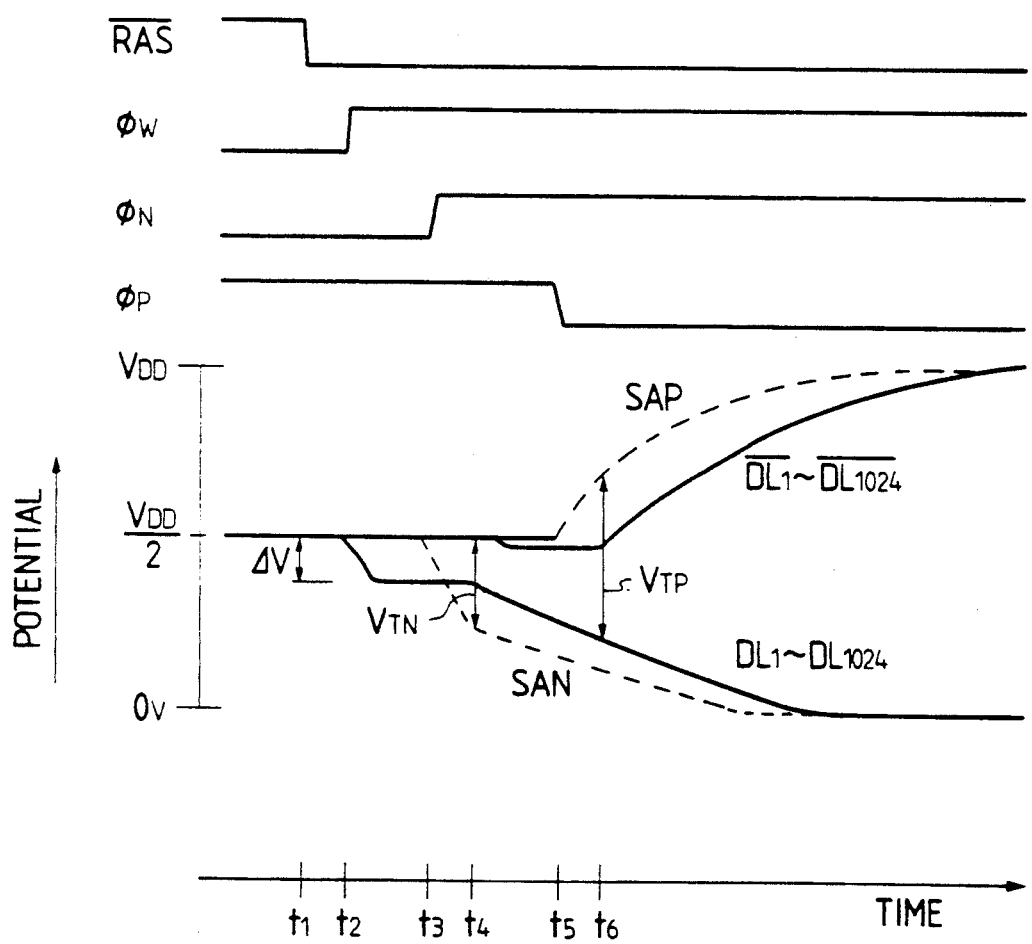
FIG. 2 shows voltage waveforms at respective nodes in the circuit of FIG. 1.
Figure 3:
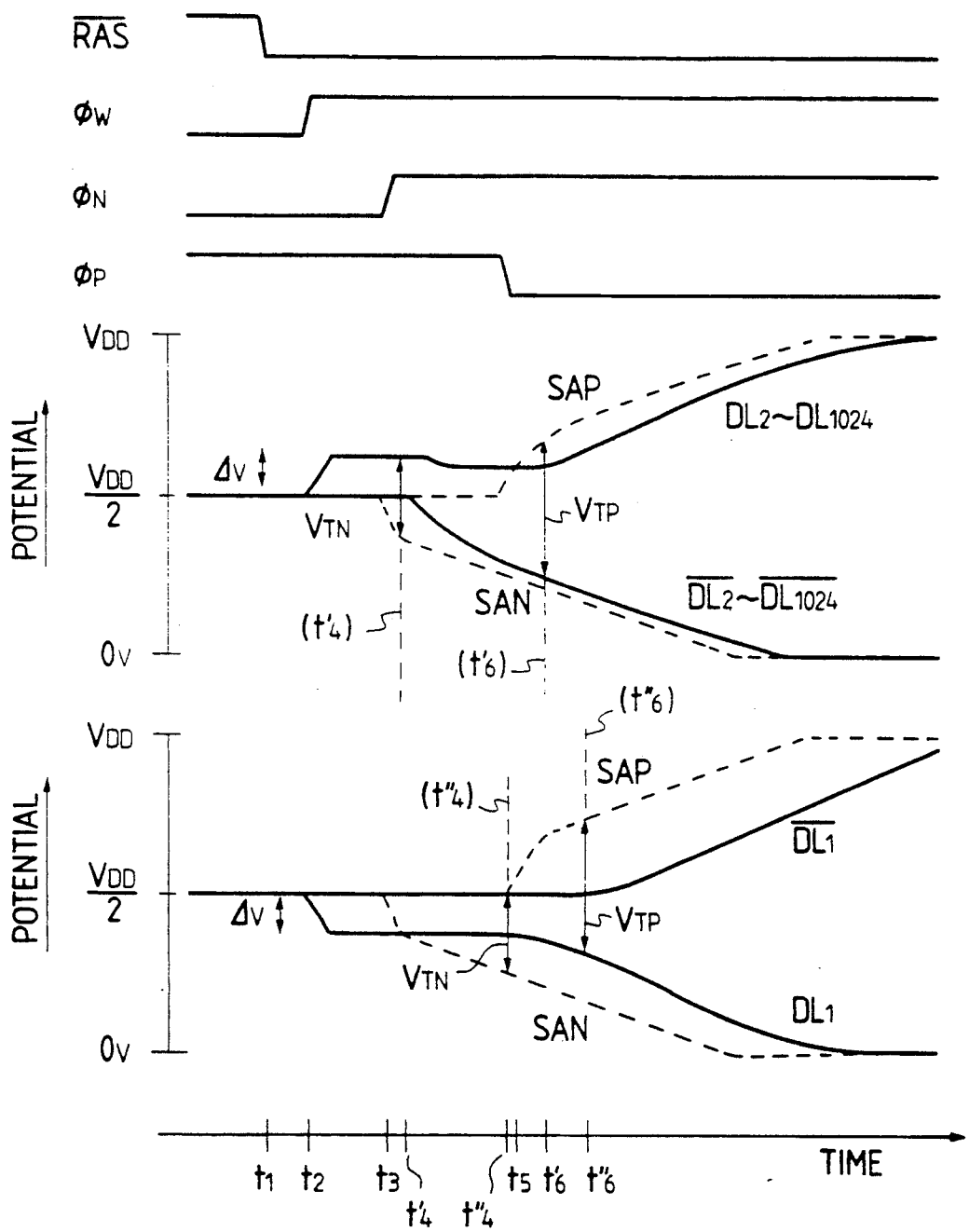
FIG. 3 shows voltage waveforms at various nodes in the circuit of FIG. 1.
Figure 5:
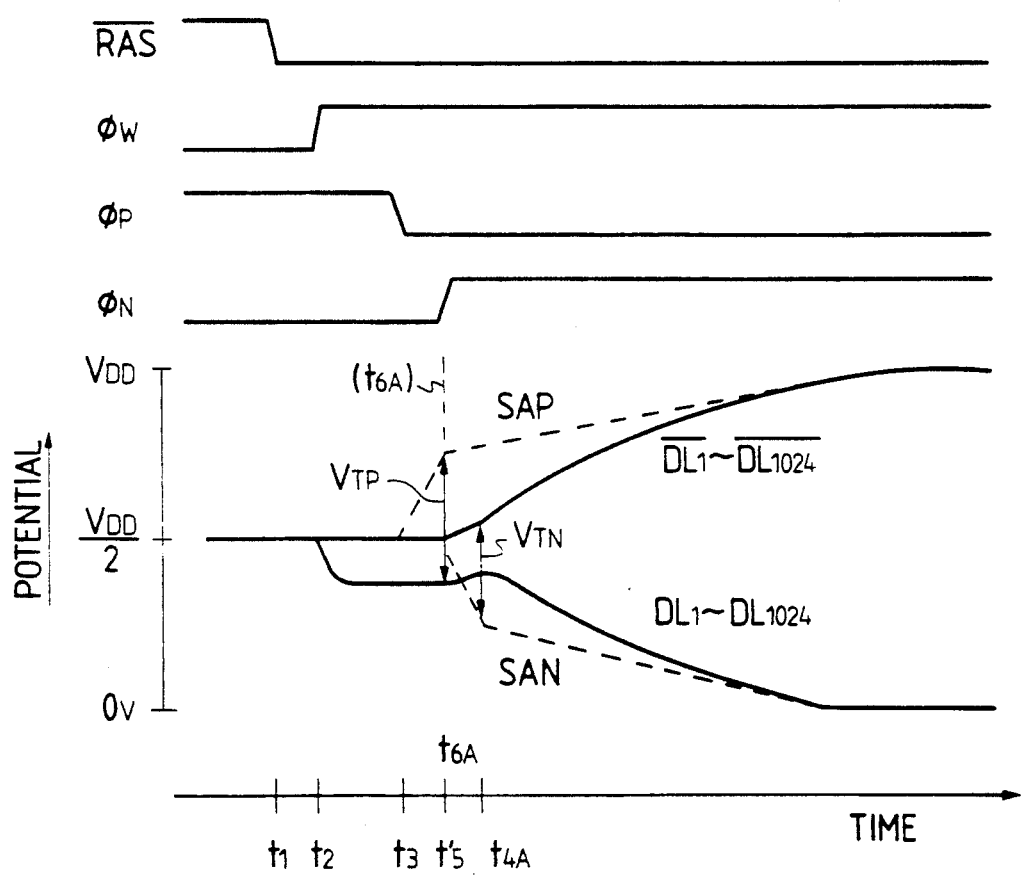
FIGS. 5 and 6 are voltage waveform diagrams for illustrating the operation at various nodes in the circuit of FIG. 4.

FIG. 5 is a voltage waveform diagram showing the operation at respective nodes in the circuit of FIG. 4. As in the case of the prior art example of FIG. 1 as described hereinabove referring to FIG. 2, it is assumed that a data value 0 is stored in all of the memory cells 1, 2, 3 of the word line WL1 when that word line is activated, and that a read operation is executed at that time. Firstly, at the time point t1, the reference clock input RAS goes to the active (low) level, then at the time point t2 the word line activation signal $\phi W$ goes to the active (high) level, whereby the word line WL1 is activated by the row decoder, so that the transfer gates (transistors Q13, Q14, Q15) of the memory cells 1, 2, 3 are each set in the conducting condition. As a result of transfer from the memory cells of an amount of charge corresponding to the data value 0 to each of the data lines DL1, DL2, DL1024, these data lines each fall slightly in potential by an amount V. The above operations are the same as for the prior art example of FIG. 2. However with this first embodiment of the present invention, the time points at which the signals $\phi N$ and $\phi P$ go to their respective active levels differ from those of the prior art example. Specifically, in FIG. 5, firstly at the time point t3 the activation signal $\phi P$ goes to the active (low) level, i.e. prior to the activation signal $\phi N$ going to the active level. Next, at the time point t5' the activation signal $\phi N$ goes to the active (high) level. In FIG. 5, the time point t3 occurs at the same time axis position as the time point t3 in FIG. 2, while the time point t5' occurs earlier than the time point t5 of FIG. 2. The switching transistor Q17 is thus set in the conducting condition at time point t3, whereby charging of the p-channel node SAP (i.e. increase in potential of that node) begins. As the potential of the node SAP increases, the potential difference between the data lines that are at a low potential (i.e. in FIG. 4, the data lines DL1 to DL1024 each of which is at a potential of approximately $V_{DD}/2 - \Delta V$) and the p-channel node SAP eventually rises above the threshold voltage of the p-channel MIS FETs of the sense amplifier circuits. At the time point when this occurs (i.e. t6A) one of the transistors of each of the p-channel flip-flops (i.e. transistors Q2, Q6, Q10) enters the conducting condition, whereby discharging of the data lines $\overline{DL1}$ to $\overline{DL1024}$ begins, and amplification operation by the p-channel flip-flops begins. Next, at the time point t5', the activation signal $\phi N$ goes to the active (high) level, the switching transistor Q16 enters the conducting condition, and discharging of the n-channel node SAN begins. As this discharging proceeds, a point is reached at which the potential difference between the data lines $\overline{DL1}$ to $\overline{DL1024}$ and the n-channel node SAN reaches the threshold voltage $V_{TN}$. At that point, amplification operation by the n-channel flip-flops begins. Finally, the potential of the data lines $\overline{DL1}$ to $\overline{DL1024}$ reaches $V_{DD}$, and the potential of the data lines DL1 to DL1024 reaches 0V (i.e. ground potential), thereby completing the sense amplifier circuit operation. As stated in the description given hereinabove of the prior art example, due to factors such as channel surface mobility, a higher amplification factor is provided by an n-channel flip-flop than by a p-channel flip-flop. With the timing relationships shown in FIG. 5, the time point of start of amplification by the n-channel flip-flop (i.e. t4A) is delayed with respect to that of the prior art example (i.e. time point t4 in FIG. 2). This is a disadvantage of the embodiment of FIG. 4. However due to the fact that with this embodiment the p-channel flip-flops are activated prior to the n-channel flip-flops, the potential of those data lines that are at a relatively high potential at the time of activation of the n-channel flip-flops is increased, and there is a corresponding increase in the amplification factor of the n-channel flip-flops. This results in a more rapid start of amplification after sense amplifier circuit activation is initiated. Thus in effect, the effect produced by the delay in starting the operation of the sense amplifier circuits and the effect produced by the speed-up which occurs after operation of the sense amplifier circuits has been started will mutually cancel. For that reason, the speed achieved is similar to that which can be achieved by the prior art example of FIG. 1.

Figure 6:
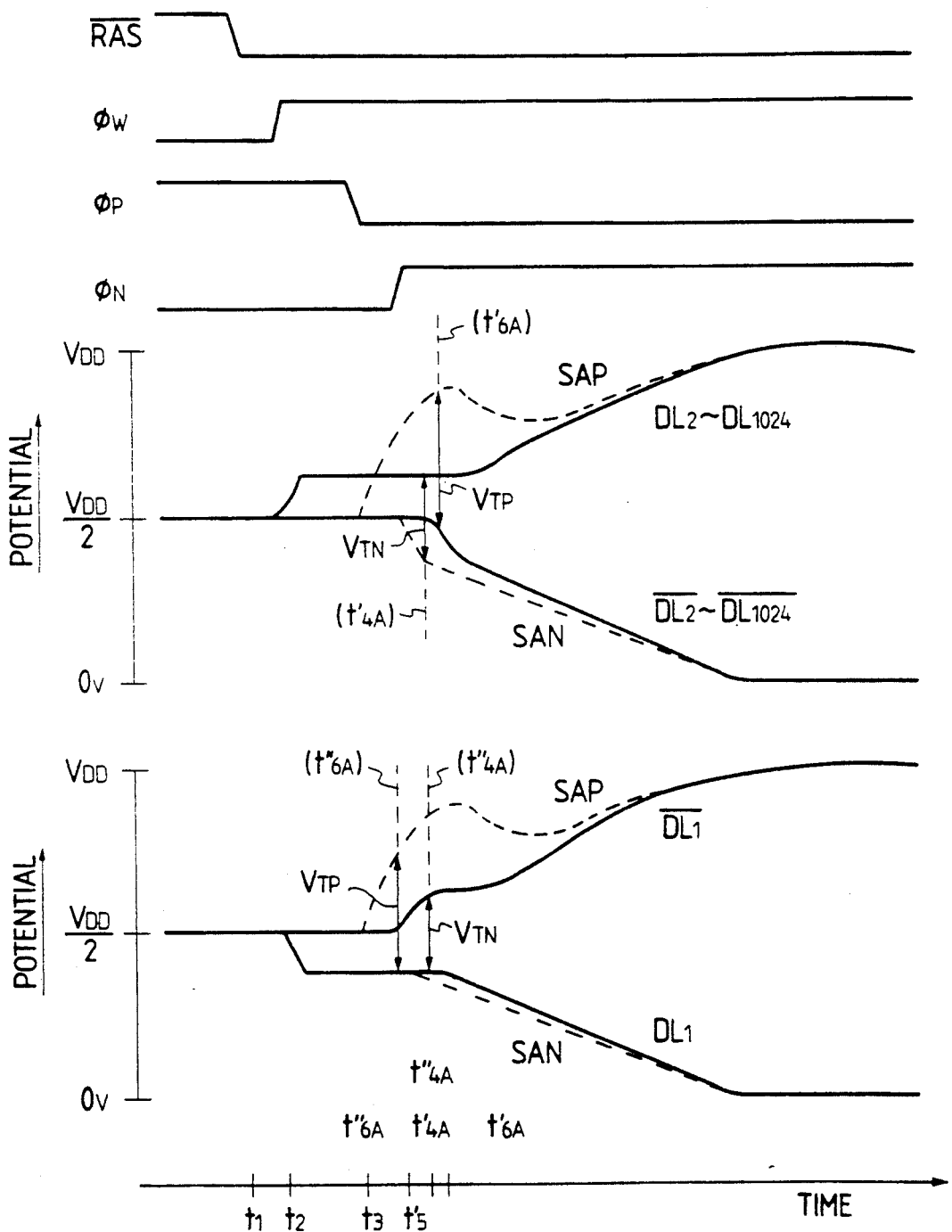

FIG. 6 illustrates the the voltage waveforms of the various nodes shown in FIG. 4 for the worst case of sense amplifier circuit operation delay as described hereinabove for the prior art example, i.e. which occurs when the memory cell 1 of the selected word line WL1 has the data value 0 stored therein, and all of the remaining memory cells of word line WL1 have the data value 1 stored. In FIG. 6, the respective operation timings of the clock signals RAS, $\phi W$, $\phi P$ and $\phi N$ go are identical to those of FIG. 5, respectively going to their active levels at time points t1, t2, t3 and t5'.

At the time point t2, the activation signal $\phi W$ goes to the active level, so that word line WL1 is activated, and charge transfer occurs from the memory cells 1, 2, 3 to the data line activation signal $\phi W$ goes to the active level, so that word line WL1 is activated, and charge transfer occurs from the memory cells 1, 2, 3 to the data lines DL1, DL2, DL1024. The data line DL1 that is connected to the memory cell 1 having the data value 0 stored therein now falls in potential by the amount $\Delta V$, while the data lines DL2 to DL1024, each connected to a memory cell having the data value 1 stored therein, will each rise in potential by the amount $\Delta V$. At the time point t3, the p-channel side activation signal $\phi P$ goes to the active level, whereby the switching transistor Q17 is set in the conducting condition, and the potential of the p-channel node SAP rises. As a result, firstly, the potential difference between the lowest potential data line (i.e DL1) and the p-channel node SAP will rise above $V_{TP}$ (at the time point t6A"), discharging of the data line $\overline{DL1}$ begins, and amplification by the p-channel flip-flop that corresponds to the data line DL1 is started. The n-channel activation signal $\phi N$ goes to the active level at the time point t5', and at time t4A' the difference between the potential of the data lines DL2 to DL1024 and the n-channel node SAN reaches the threshold voltage $V_{TN}$, and operation of the n-channel flip-flops is started. At that point in time, amplification operation by the p-channel flip-flop of data line $\overline{DL1}$ is already in progress, so that at t4A' since the potential of the data line DL1 has risen to almost the same level as that of the data lines DL2 to DL1024, the potential difference between $\overline{DL1}$ and the n-channel node SAN will reach $V_{TN}$ at a time point t4A" that almost coincides with t4A'. Thus, the amplification operation of the n-channel flip-flop of the data line DL1 begins at almost the same time as n-channel flip-flop amplification of the data lines DL2 to DL1024. Finally, at time point t6A', when amplification operation by the p-channel flip-flops respectively corresponding to the data lines $\overline{DL2}$ to $\overline{DL1024}$ begins, overall sense amplifier circuit operation has commenced.

Thus, by comparison with the prior art example, there is no significant delay in the operation of the sense amplifier circuit that corresponds to data line DL1. This is due to the fact that prior to the n-channel flip-flops being activated by the signal $\phi N$, the activation signal $\phi P$ goes to the active level, thereby initiating operation of the p-channel flip-flops, so that the high potential line of the data line pair DL1, $\overline{DL1}$ (i.e. the only pair to be connected to a memory cell having the data value 0 stored therein) can be pulled up beforehand to the same potential as the other data lines. That is to say, there is a data line potential adjustment function.

With the first embodiment of the invention as described in the above, activation of the p-channel dynamic flip-flops occurs prior to that of the n-channel dynamic flip-flops, so that, irrespective of whether the data value read out from a memory cell is 0 or 1, substantially constant speed of operation of the sense amplifier circuits can be achieved. Moreover, in the case of a large number of memory cells having the data value 1 stored therein, and only a small number of memory cells having the data value 0 stored therein, there is no significant lowering of the sense amplifier circuit operation speed, so that an overall high operating speed can be achieved for the sense amplifier circuits.

Figure 7:
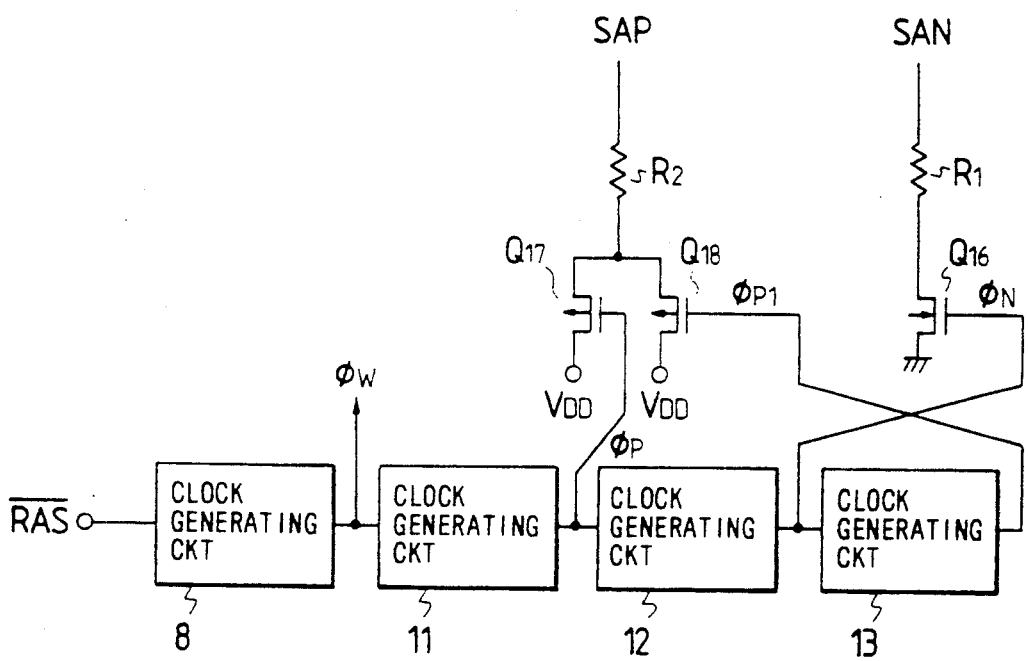
FIG. 7 is a circuit diagram of a second embodiment of the present invention.

A second embodiment of the present invention will be described in the following. FIG. 7 shows the circuit configuration of the main components of the second embodiment. This embodiment also includes an array of two rows of 1024 columns of memory cells, with each column being provided with a sense amplifier circuit and with a row decoder also being included. However components shown in FIG. 4, other than those required for driving the nodes SAN and SAP, have been omitted from FIG. 7 The embodiment of FIG. 7 differs from that of FIG. 4 in that a pair of p-channel side switching transistors Q17 and Q18 are used, rather than the single switching transistor Q17 of the embodiment of FIG. 4, and an additional clock generating circuit 13 is provided for generating a clock signal $\phi PI$ for driving the transistor Q18.

With regard to the first objective of the present invention, i.e. to achieve a high speed of sense amplifier circuit operation, a certain degree of improvement can be achieved by the first embodiment of the invention shown in FIG. 4. However with the configuration of FIG. 4, each of the p-channel flip-flops (which provide a lower degree of amplification than the n-channel flip-flops) of the sense amplifier circuits is activated prior to the n-channel flip-flops being activated. Thus, there is a danger of a lowering of the sense amplifier circuit sensitivity, so that it is difficult to achieve both a high degree of sense amplifier circuit sensitivity and also a high speed of operation. With the configuration of FIG. 7, the current drive capability of the switching transistor Q17 (which is driven by the activation signal $\phi P$, and hence is activated prior to the time point at which the activation signal $\phi N$ goes to the active level) is held to the minimum value that is required to achieve adjustment of the data line potential. The switching transistor Q18 on the other hand, which is driven by the activation signal $\phi PI$ and is activated after the signal $\phi N$ has gone to the active level, has a sufficiently high drive capability to ensure that high speed operation is achieved.

Thus with the second embodiment of the present invention as described in the above, a pair of switching transistors are incorporated for activating the p-channel node SAP, with one of these transistors being activated prior to activation of the n-channel switching transistor and the second of these transistors being activated after activation of the switching transistor that is connected to the n-channel node SAN. A combination of high sensitivity and high speed of operation for the sense amplifier circuits is thereby achieved.

With the present invention, the differences in data line potential between respective ones of a plurality of sense amplifier circuits that are connected in common can be cancelled, at the time when the operation of the n-channel flip-flops of the sense amplifier circuits (which perform the main amplification function of the sense amplifier circuits) begins. Thus, delay in the start of sense amplifier circuit amplification operation is reduced, so that a higher speed of sense amplifier circuit operation can be achieved. In addition, stable operation is realized.

The present invention thus enables a significant improvement to be achieved in the performance of a DRAM type of semiconductor memory apparatus having a large storage capacity.

What is claimed is:

1. A semiconductor memory apparatus comprising a plurality of sense amplifier circuits arrayed in parallel, each sense amplifier circuit including:

first and second data lines respectively connected in parallel to a plurality of memory cells;

a first flip-flop formed of first and second n-channel metal insulation semiconductor field effect transistors with the source electrodes thereof connected in common, with the gate electrodes and drain electrodes thereof mutually cross-coupled, and with the drain electrodes thereof respectively connected to the first and second data lines;

a second flip-flop formed of first and second p-channel metal insulation semiconductor field effect transistors with the source electrodes thereof connected in common, the gate electrodes and drain electrodes thereof mutually cross-coupled, and with the drain electrodes thereof respectively connected to the first and second data lines, the source electrodes of the first flip-flops of the plurality of sense amplifier circuits being mutually connected as a first common connection node, and the source electrodes of the second flip-flops of the plurality of sense amplifier circuits being mutually connected as a second common connection node;

a first switching transistor coupled between the second common connection node and a first potential of a power source;

a second switching transistor coupled between the first common connection node and a second potential of the power source;

a third switching transistor coupled between the second common connection node and the first potential of the power source; and operation timing means operable for initiating a read operation of the semiconductor memory apparatus, including means for consecutively setting the first switching transistor into a conducting condition at a first predetermined time point, the second switching transistor into a conducting condition at a second predetermined time point subsequent to the first time point, and the third switching transistor into a conducting condition at a third predetermined time point subsequent to the second time point.

* * * * *